US006534860B2

United States Patent
Turner

(10) Patent No.: US 6,534,860 B2
(45) Date of Patent: Mar. 18, 2003

(54) THERMAL TRANSFER PLATE

(75) Inventor: Leonard Turner, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/454,829

(22) Filed: Dec. 6, 1999

(65) Prior Publication Data

US 2002/0185728 A1 Dec. 12, 2002

(51) Int. Cl.[7] ............................................. H01L 23/34
(52) U.S. Cl. ................. 257/718; 257/675; 257/704; 257/705; 257/706; 257/712; 438/106; 438/117
(58) Field of Search ................. 257/669, 675, 257/705, 706, 712, 718, 733

(56) References Cited

U.S. PATENT DOCUMENTS 5,737,187 A * 4/1998 Nguyen et al. ............. 361/704
5,923,530 A * 7/1999 Marayama et al. ......... 361/687

FOREIGN PATENT DOCUMENTS

JP             05021648 A  *  1/1993  ........... H01L/23/29

* cited by examiner

Primary Examiner—Olik Chaudhuri
Assistant Examiner—Wai-Sing Louie
(74) Attorney, Agent, or Firm—Fish & Richardson P.C.

(57) ABSTRACT

A thermal transfer plate (TTP) includes a thermally conductive plate, at least one footpad and at least one reference protrusion. The footpad includes a spring zone and a stand-off member. In an implementation, the reference protrusion contacts a top surface of a substrate. In another implementation, the reference protrusion contacts a top surface of an integrated circuit. Both implementations permit the thickness of the gap between the integrated circuit and the TTP to be optimized for efficient transfer of heat from an integrated circuit.

6 Claims, 3 Drawing Sheets

THERMAL TRANSFER PLATE

BACKGROUND OF THE INVENTION

The present invention relates to a thermal transfer plate (TTP) for coupling a thermal hardware element to an integrated circuit package. In particular, the thermal transfer plate includes protrusions that control the spacing between the integrated circuit and the TTP.

Semiconductor chips produce heat when powered up and operated. Consequently, a thermally conductive plate having a surface area larger than the semiconductor chip is typically used to transfer heat to a heat sink or another type of thermal management hardware. FIG. 1 is a side view of a prior art electrical assembly 10 including a semiconductor chip 2 that generates heat, a printed circuit board (PCB) 4, a thermally conductive plate 5, a heat sink 6, and a clamping structure 7. The semiconductor chip 2 is thermally coupled to the thermal plate 5 by a thin layer of conductive material 8 or thermal grease, which minimizes the thermal impedance between the two components. The chip 2 is connected to the substrate 4 by means of an array of solder ball connections 9. The thermal plate 5 contains mounting points for the heat sink 6. Screws 11 connect the plate 5 to the circuit board 4 through fixed standoffs 12.

The gap between the conductive plate 5 and the top surface of the semiconductor chip 2 must not be too close because the two surfaces should be covered entirely by the thermal grease. Non-wetted areas increase the effective thermal resistance between the plate and the semiconductor chip in those areas. Care must also be taken to ensure that the gap between the top surface of the integrated circuit and the thermal plate is not too wide because wider gaps, even when they are filled with thermal grease, degrade thermal performance.

The electrical assembly 10 is typically incorporated into a computer which may be subjected to external shock and vibration loads. Such external vibrations may create a physical separation between the thermal plate 5 and the semiconductor chip 2. Any separation will increase the thermal impedance between the thermal plate and the semiconductor chip and cause an increase in the junction temperatures of the integrated circuit. In addition, any relative movement between the thermal plate and the semiconductor chip may "pump" the thermal grease out of the thermal interface. A reduction in thermal grease will also increase the thermal impedance, resulting in an increase in the junction temperatures of the integrated circuit.

Since the thermal plate 5 mounts on fixed standoffs 12, the stand-off height 14 must be great enough to assure that the top surface of the integrated circuit component 2 on the substrate 4 does not bottom out against a bottom surface of the thermal plate 5. Thus, when an electrical assembly 10 is being designed, a designer must compensate for varying tolerances. In particular, using the printed circuit board 4 as the references, a designer must consider the tolerances in the flatness of the PCB, the semiconductor thickness tolerance, the collapsed solder-ball-height tolerance, the thermally conductive plate flatness, the thermal plate standoff-height tolerance and several other tolerance measures.

New generation integrated circuits, such as faster CPU semiconductor chips, generate more heat. It would thus be desirable to modify the assembly shown in FIG. 1 to optimize and control the gap between the semiconductor chip and the thermally conductive plate, and to prevent separation between the thermal element and the integrated circuit package to ensure adequate cooling of the integrated circuit. It would also be desirable to mitigate or eliminate substantially all of the tolerance accumulations described above.

SUMMARY OF THE INVENTION

Presented is a thermal transfer plate for coupling thermal hardware to a substrate that includes an integrated circuit. The thermal transfer plate includes a thermally conductive plate and at least one footpad. The footpad is connected to the plate by way of a spring zone and a standoff member. The TTP includes at least one reference protrusion. In one implementation, the reference protrusion contacts a top surface of a substrate. In another implementation, the TTP includes a die cavity having at least one reference protrusion for contacting a top surface of an integrated circuit die.

A thermal transfer plate according to the invention substantially eliminates tolerance accumulations which plague the design of electrical assemblies. Further, if the reference protrusions are formed by using a precision forming-die, then the gap between the top portion of the integrated circuit and the plate can be reduced. Such thin gaps transfer more heat which permits use of the thermal transfer plate with faster running, and thus hotter, semiconductor devices. Yet further, a TTP according to the invention prevents an inverted impact shock from separating the TTP from the integrated circuit die.

Other advantages and features of the invention will be apparent from the following description and from the claims.

DETAILED DESCRIPTION

Figure 1:
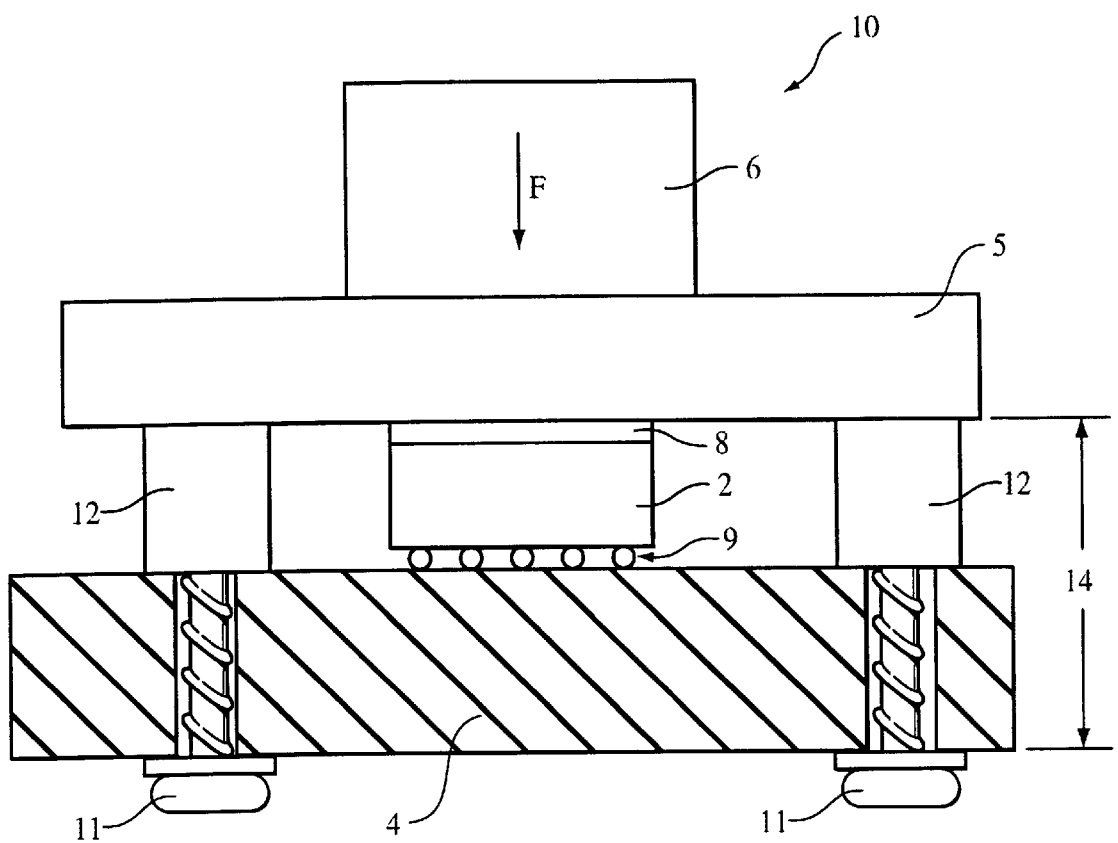
FIG. 1 is a side view of a prior art electrical assembly.
Figure 2A:
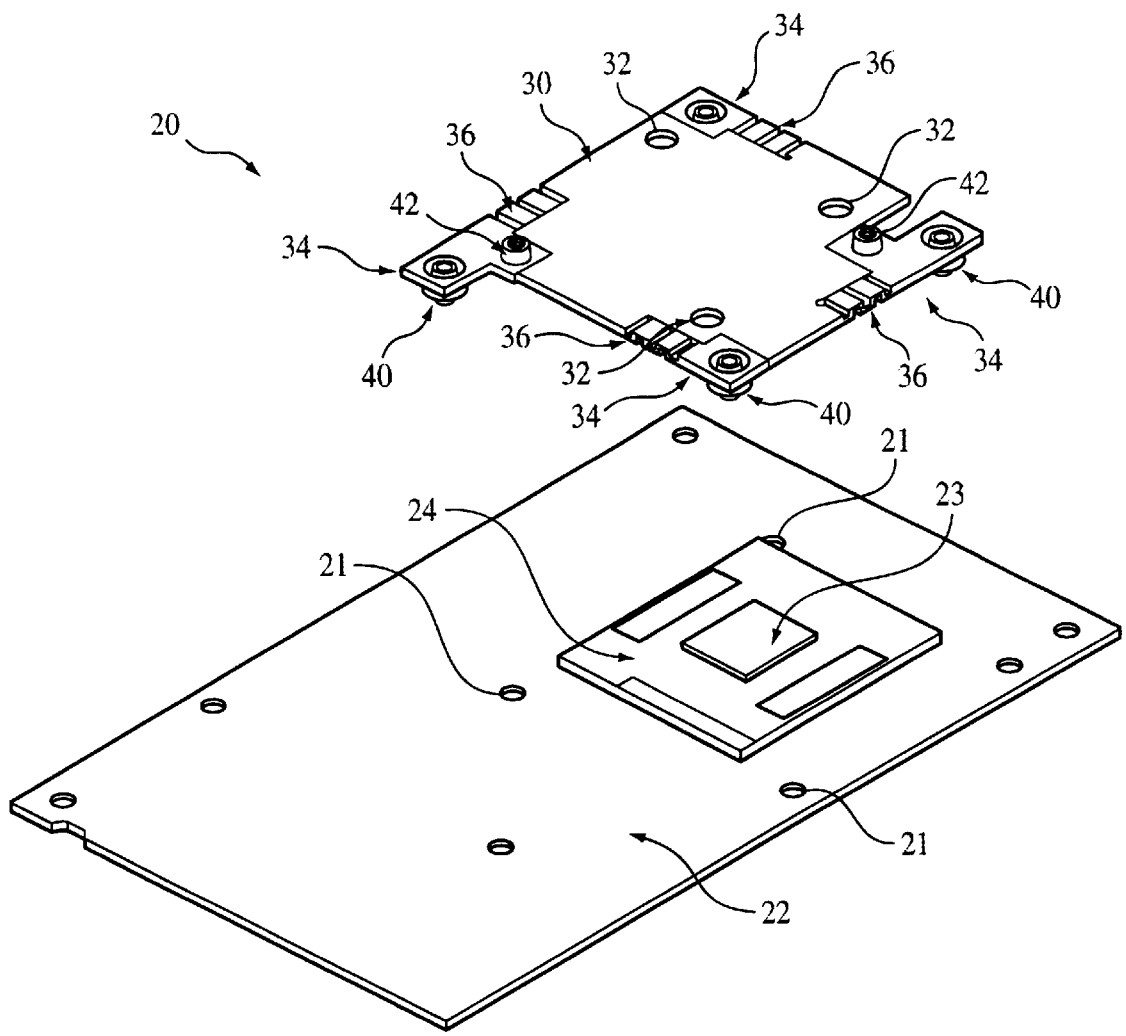
FIG. 2A is a simplified, exploded, perspective view of an embodiment of an electrical assembly according to the invention.

FIG. 2A is a simplified, exploded, perspective view of an embodiment of an Organic-Land-Grid Array (OLGA) reference electrical assembly 20. The OLGA component package 24 is connected to the top surface of a module substrate 22. A semiconductor device 23, such as a central processing unit (CPU), is connected to the top surface of the OLGA substrate 24. A thermal transfer plate (TTP) 30 may be composed of a thermally conducting material such as copper, and includes three reference protrusions 32 which appear as dimples on the top side of the plate. The protrusions 32 extend to touch the OLGA substrate 24 from the bottom of the TTP (best seen in FIG. 2B), so that the TTP is held a specific distance from the OLGA substrate. The protrusions may be formed with a precision forming-die so that the height of the protrusions would be substantially uniform making any added tolerance consideration a relatively small number. As a result, the semiconductor 23 to thermal transfer plate 30 gap tolerance is reduced which permits design of a thinner gap. A thinner gap in combination with thermal grease allows for more efficient transfer of heat which permits hotter semiconductors to operate safely.

Figure 2B:
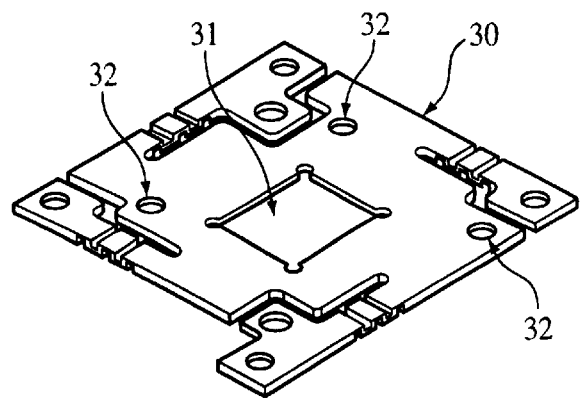
FIG. 2B is a perspective view of the opposite side of the thermal transfer plate depicted in FIG. 2A.

FIG. 2B is a perspective view of the opposite side of the TTP 30 depicted in FIG. 2A. A die cavity 31 is dimensioned to encase the top surface of the CPU die 23 shown in FIG. 2A. The protrusions 32 extend out from the TTP and bottom out on the top surface of the OLGA substrate 24 when installed. The reference protrusions 32 fix the vertical relationship of the TTP to the semiconductor die 23. During installation, a thermally conductive material is deposited on the top surface of the CPU die 23 for contacting the die cavity when the TTP plate is installed.

Referring again to FIG. 2A, the TTP 30 also includes a plurality of footpads 34 on the outside edge portion of the plate. Each footpad includes a spring zone 36 and a standoff member 40. The standoff members 40 are deliberately too short to reach down to the top surface of the module substrate 22 when the TTP is placed on top of the OLGA substrate, to assure that the reference protrusions 32 will bottom out on the top surface of the OLGA substrate 24. The standoff members 40 and footpads 34 are connected to the TTP 30 via spring zones 36 which permit depression of the footpads toward the module substrate 22 during installation. During installation the standoff members are permanently secured through apertures 21 in the module substrate 22.

FIG. 2A also depicts thermal mounting points 42 on two of the footpads 34 which are available for connection to system-level thermal management hardware (not shown), such as a heat sink or the like. Each mounting point 42 is located on an indented portion of the footpad in between the spring zone 36 and the standoff member 40. Thus, when such thermal hardware is mounted to the mounting points, a "box clamp" structure is formed. The thermal hardware becomes one member of the box clamp structure and the module substrate 22 becomes the other member. The box-clamp presses upward on the solder joints of the semiconductor component and downward on the top surface of the thermally active portion of the TTP 30. The clamping force thus generated keeps the reference protrusions 32 in contact with the top surface of the OLGA substrate 24. This assures that any force exerted by the thermal hardware, such as that produced by an upside-down product drop (for example, when a consumer drops her laptop) will be transferred to the module substrate 22 without disturbing the position of the thermally active portion of the TTP 30. In addition, this footpad and reference protrusion structure compensates for tolerance variations in the thickness of the CPU chip 23, the variations in the solder-ball attachment process of the CPU to the OLGA substrate 24, and for variations in bump height or die cavity depth in the TTP 30.

The OLGA referenced electrical assembly 20 of FIGS. 2A and 2B greatly reduces the tolerance of the gap thickness between the semiconductor die and the TTP in comparison to conventional thermal plates. Therefore, a TTP plate may be designed to provide adequate heat dissipation for faster semiconductor chips.

Figure 3A:
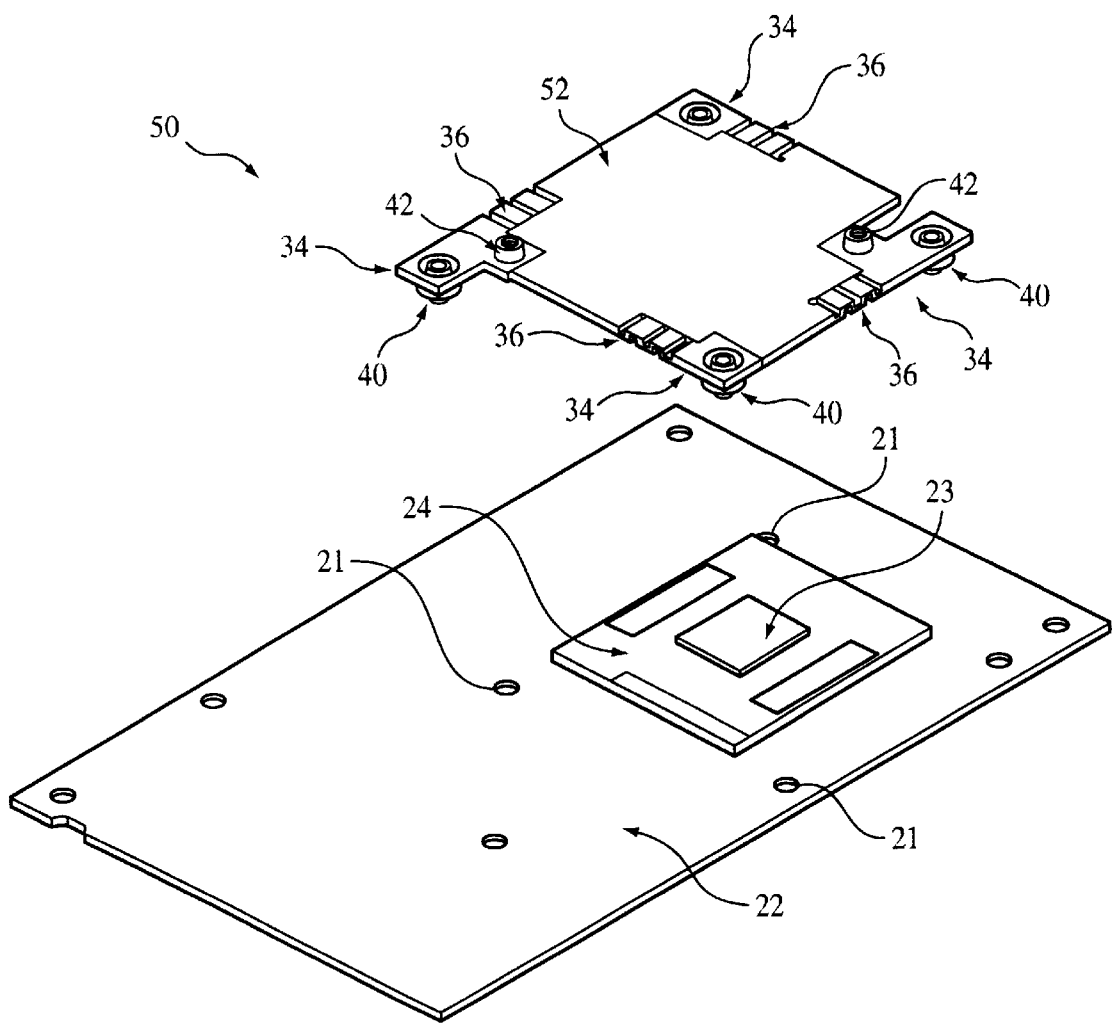
FIG. 3A is a simplified, exploded, perspective view of another embodiment of an electrical assembly according to the invention.

FIG. 3A is a simplified, exploded, perspective view of an implementation of a die-referenced electrical assembly 50. (Like reference numbers are used when describing the same elements referred to in FIG. 2A.) An OLGA component package 24 is connected to the top surface of a module substrate 22, and a thermal transfer plate (TTP) 52 is shown. A semiconductor device 23, such as a central processing unit (CPU), is connected to the top surface of the OLGA substrate.

Figure 3B:
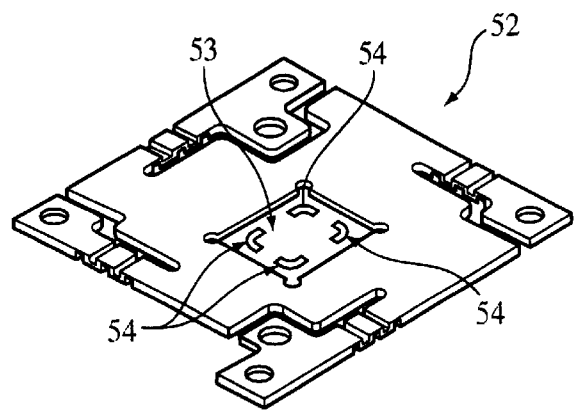
FIG. 3B is a perspective view of the opposite side of the thermal transfer plate depicted in FIG. 3A.

FIG. 3B is a perspective view of the opposite side of the TTP 52 depicted in FIG. 3A. A die cavity 53 is dimensioned to encase the CPU die 23 and includes reference protrusions 54 that bottom out on the top surface of the CPU die itself when installed. The protrusions 54 fix the relationship of the TTP to the CPU die 23, and may be formed with a precision forming-die so that the height of the protrusions would be substantially uniform. Thus, any added tolerance would be a very small number. Consequently, the CPU die 23 to TTP 52 gap tolerance would be reduced which permits design of a thinner gap to optimize heat transfer of hotter (faster) operating semiconductors. A thermally conductive material such as thermal grease would be deposited on the top surface of the CPU die 23 during installation, for contacting the die cavity and the TTP plate surface.

Referring again to FIG. 3A, the TTP 52 also includes a plurality of footpads 34 that each include a spring zone 36 and a standoff member 40. The standoff members 40 are deliberately too short to reach down to the top surface of the module substrate 22 when the TTP is placed on top of the OLGA substrate 24, to assure that the protrusions 54 of the die cavity 53 will bottom out on the top surface of the semiconductor die 23. The standoff members 40 and footpads 34 are connected to the TTP 52 via spring members 36 which permit depression of the footpads toward the module substrate 22 during installation. The standoff members are permanently secured through apertures 21 in the module substrate 22 when installed.

FIG. 3A also depicts thermal mounting points 42 on two of the footpads 34 which are available for connection to system-level thermal management hardware (not shown), such as a heat sink or the like. Each mounting point 42 is located on an indented portion of the footpad in between the spring zone 36 and the standoff member 40. Thus, when such thermal hardware is mounted to the mounting points, a "box clamp" structure is formed. The hardware becomes one member of the box clamp structure and the module substrate 22 becomes the other member. The box-clamp presses upward on the solder joints of the semiconductor component and downward on the top surface of the thermally active portion of the TTP 52. The clamping force thus generated keeps the reference protrusions 54 in contact with the top surface of the semiconductor die 23. The structure compensates for tolerance variations in the height of the reference protrusions 54. Thus, the die-referenced electrical assembly 50 eliminates all of the tolerance considerations except for reference protrusion height variations. Consequently, substantially all of the gap tolerance considerations of conventional thermal plate assemblies are eliminated so that a designer can optimize the gap thickness and thus the thickness of the thermal grease to provide adequate heat dissipation for fast semiconductor chips.

While exemplary implementations have been described and shown in the drawings, such implementations are merely illustrative and are not restrictive of the broad invention. Thus, it should be understood that various other modifications may occur to those of ordinary skill in the art that fall within the scope of the following claims.

What is claimed is:

1. A thermal transfer plate, comprising:
   a thermally conductive plate having a top side and a bottom side that includes a die cavity;
   at least one footpad connected to the plate and including a spring zone and a standoff member; and
   at least one reference protrusion associated with the die cavity of the plate, wherein the spring zone permits depression of the footpad towards a module substrate to enable the at least one reference protrusion to bottom out on a top surface of a die.

2. The thermal transfer plate of claim 1 further comprising a reference protrusion positioned to contact a top surface of a substrate.

3. Thermal transfer plate of claim 1 further comprising a reference protrusion positioned in the die cavity.

4. The thermal transfer plate of claim 1 further comprising a thermal hardware mounting point on the footpad.

5. The thermal transfer plate of claim 1 further comprising four footpads connected to the plate in a substantially square arrangement.

6. The thermal transfer plate of claim 1 further comprising a spring zone formed in the plane of the plate.

* * * * *